(12) United States Patent
Tan et al.

(10) Patent No.: US 7,977,248 B2
(45) Date of Patent: Jul. 12, 2011

(54) DOUBLE PATTERNING WITH SINGLE HARD MASK

(75) Inventors: Elliot Tan, Portland, OR (US); Michael K. Harper, Hillsboro, OR (US); James Jeong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 821 days.

(21) Appl. No.: 12/006,204

(22) Filed: Dec. 31, 2007

(65) Prior Publication Data

US 2009/0170316 A1 Jul. 2, 2009

(51) Int. Cl.
*H01L 21/302* (2006.01)

(52) U.S. Cl. ........ 438/717; 438/585; 438/587; 438/399; 438/696; 430/313; 430/311

(58) Field of Classification Search .................. 438/717, 438/585, 587, 399, 696; 430/313, 311
See application file for complete search history.

(56) References Cited

U.S. PATENT DOCUMENTS

| 6,110,331 A * | 8/2000 | Rolfson ............... 204/224 M |
| 6,872,647 B1 * | 3/2005 | Yu et al. .................. 438/585 |
| 2007/0172770 A1 * | 7/2007 | Witters et al. ........... 430/313 |

* cited by examiner

*Primary Examiner* — Duy-Vu N Deo
*Assistant Examiner* — Maki A Angadi
(74) *Attorney, Agent, or Firm* — Douglas J. Ryder; Ryder, Lu, Mazzeo and Konieczny, LLC

(57) ABSTRACT

In general, in one aspect, a method includes forming a hard mask on a semiconductor substrate. A first resist layer is patterned on the hard mask as a first plurality of lines separated by a first defined pitch. The hard mask is etched to a portion of formed thickness to create a first plurality of fins in alignment with the first plurality of lines and the first resist layer is removed. A second resist layer is patterned on the hard mask as a second plurality of lines separated by a second defined pitch. The second plurality of lines is patterned between the first plurality of lines. The hard mask is etched to the portion of the formed thickness to create a second plurality of fins in alignment with the second plurality of lines. The first plurality of hard mask fins and the second plurality of hard mask fins are interwoven and have same thickness.

20 Claims, 4 Drawing Sheets

DOUBLE PATTERNING WITH SINGLE HARD MASK

BACKGROUND

As semiconductor devices continue to be scaled to smaller sizes, lithography technology may not be able to pattern masking layers having the desired pitch. Accordingly, lithography may become a limiting factor in the scaling of semiconductor devices.

BRIEF DESCRIPTION OF THE DRAWINGS

The features and advantages of the various embodiments will become apparent from the following detailed description in which.

DETAILED DESCRIPTION

In order to enable further scaling of semiconductor devices double patterning is used to pattern the active layers (e.g., polysilicon) to form devices (e.g., transistor fins, gate stacks) therein. The double patterning includes using multiple resist layers to pattern a single hard mask that is used to pattern the active layers. As the hard mask may remain on the active layers to act as a cap layer after etching the active layers, the thickness of the hard mask after patterning needs to be substantially conformal. In addition, the thickness of remaining hard mask should be substantially the desired thickness to act as the cap layer. The initial thickness of the hard mask may be twice the desired thickness of the cap layer. FIGS. 1-7 illustrate an example process to scale formation of the devices in the active layers using a double patterning of a single hard mask layer.

Figure 1:
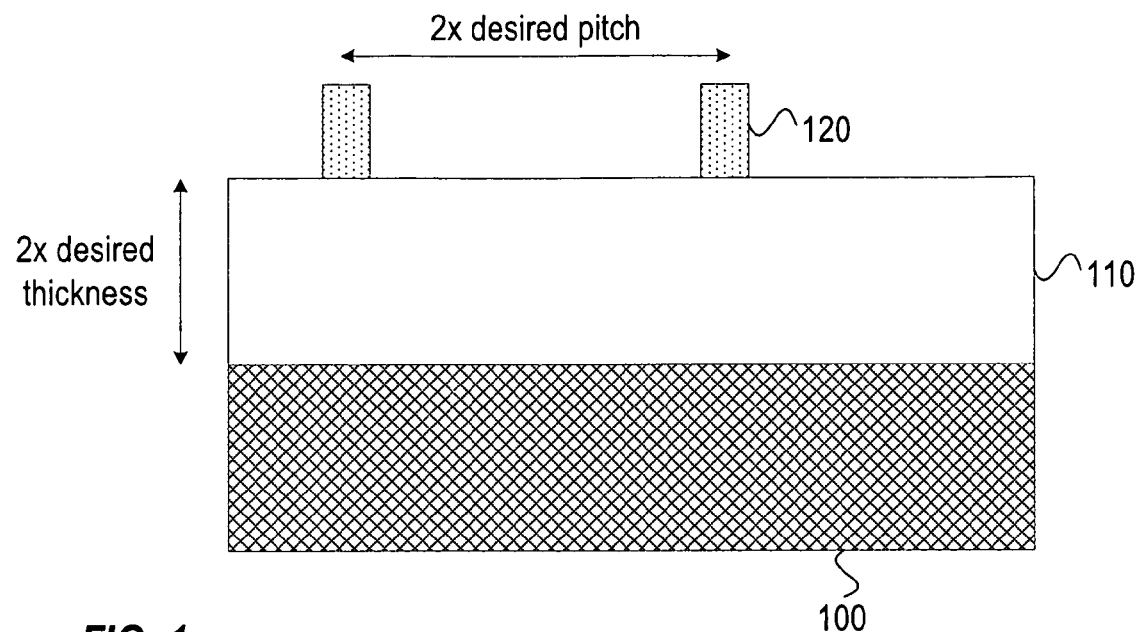
FIG. 1 illustrates an example substrate having a conductive layer, a hard mask layer formed on the conductive layer, and a first resist layer patterned on the hard mark layer, according to one embodiment.

FIG. 1 illustrates an example semiconductor substrate having a conductive layer 100 (e.g., polysilicon), a hard mask layer 110 (e.g., dielectric) formed on the conductive layer 100, and a first resist layer patterned on the hard mark layer 110. The first resist layer (e.g., photo resist) is patterned as a plurality of lines 120 (first resist pattern), where the lines are separated by a pitch (e.g., 160 nm). The pitch may be the minimum pitch attainable with lithography and/or may be twice the desired pitch if lithography can not obtain the desired pitch. The hard mask layer 110 may have a thickness that is twice the desired thickness (e.g., thickness of the hard mask 110 utilized as a cap layer). The conductive layer 100, the hard mask layer 110, and the first resist layer may be formed through any number of known processes. The first resist pattern 120 may be created through any number of known processes including known lithography processes.

Figure 2:
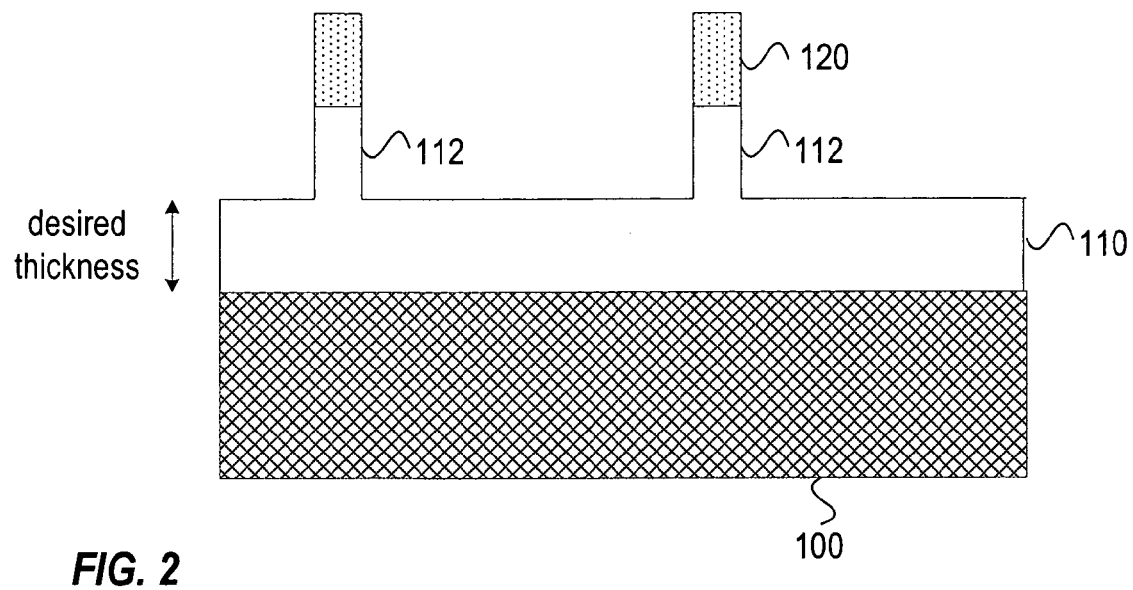
FIG. 2 illustrates the example substrate after the hard mask is etched, according to one embodiment.

FIG. 2 illustrates the example substrate after the hard mask 110 is etched using the first resist pattern 120. The hard mask 110 is etched the desired thickness (half the thickness of the hard mask layer 110 is etched and half remains). The hard mask 110 that remains after etching is at the desired thickness. The hard mask 110 covered by the first resist pattern 120 is now a hard mask fin 112 that remains at twice the desired thickness. The hard mask layer 110 may be etched through any number of known processes.

Figure 3:
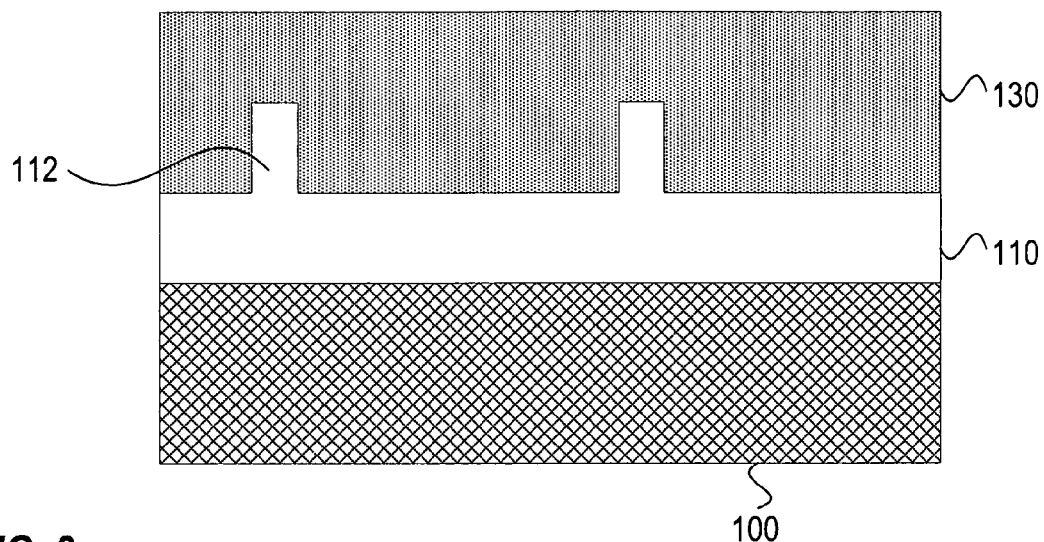
FIG. 3 illustrates the example substrate after the first resist layer is removed and a second resist layer is formed over the remaining hard mask, according to one embodiment.

FIG. 3 illustrates the example substrate after the first resist pattern 120 is removed and a second resist layer 130 (e.g., photo resist) is formed over the remaining hard mask 110, and hard mask fins 112. The second resist layer 130 may be formed through any number of known processes.

Figure 4:
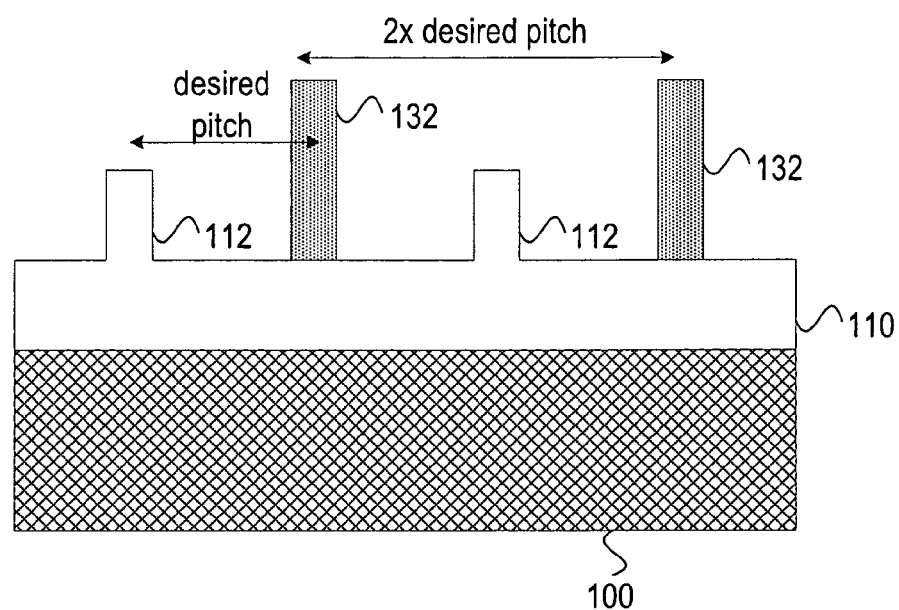
FIG. 4 illustrates the example substrate after the second resist layer is patterned as a plurality of lines, according to one embodiment.

FIG. 4 illustrates the example substrate after the second resist layer 130 is patterned as a plurality of lines 132 (second resist pattern), where the lines 132 are separated by the pitch (e.g., twice the desired pitch) and the lines 132 are placed between the hard mask fins 112 previously formed by etching the hard mask 110 with the first resist pattern 120. The pitch between the lines 132 and the hard mask fins 112 is the desired pitch (e.g., 80 nm). The second resist layer 130 may be patterned through any number of known processes including known lithography processes.

Figure 5:
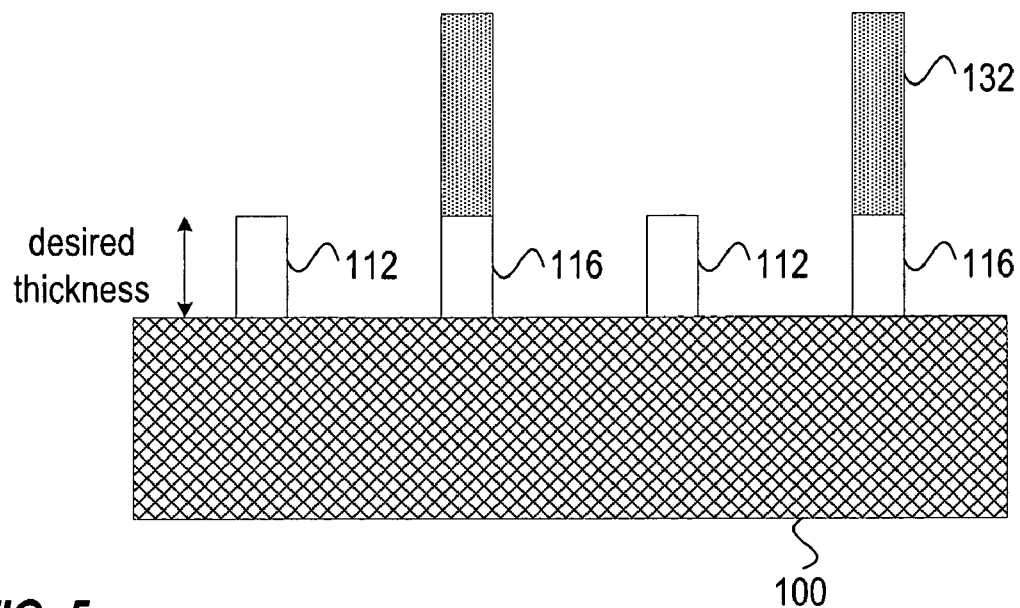
FIG. 5 illustrates the example substrate after the hard mask is etched using the second resist layer as the pattern, according to one embodiment.

FIG. 5 illustrates the example substrate after the hard mask 110 is etched using the second resist pattern 132. The hard mask 110 is etched the desired thickness. The hard mask 110 previously etched and not covered by the lines 132 is removed. The hard mask fins 112 are etched such that half the hard mask material is removed while half remains so that the hard mask fins 112 are the desired thickness. The hard mask 110 covered by the second resists pattern 132 is now a hard mask fin 116 that remains at the desired thickness. The fins 112, 116 are interwoven with each other and are the desired thickness. The hard mask layer 110 may be etched through any number of known processes.

Figure 6:
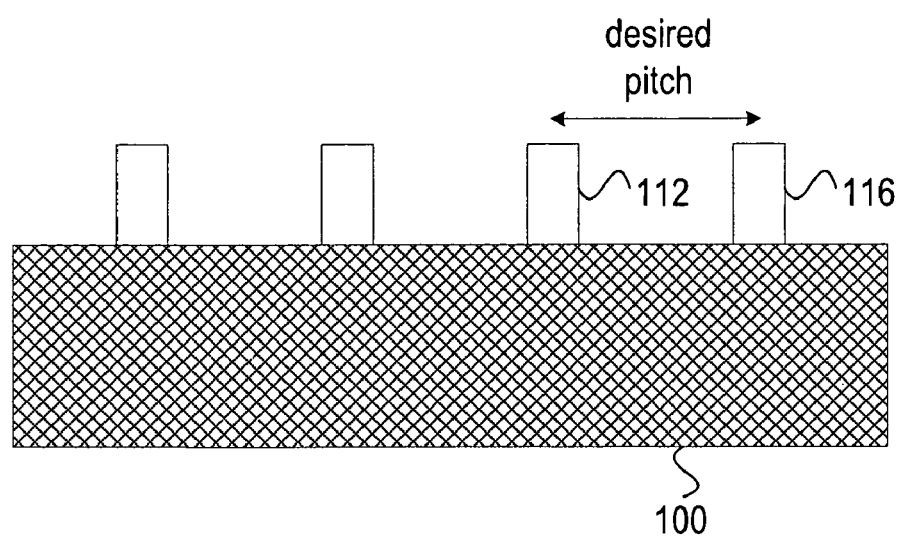
FIG. 6 illustrates the example substrate after the lines are removed, according to one embodiment.

FIG. 6 illustrates the example substrate after the second resist pattern 132 is removed. The fins 112, 116 are separated by the desired pitch. The second resist pattern 132 may be removed and through any number of known processes.

Figure 7:
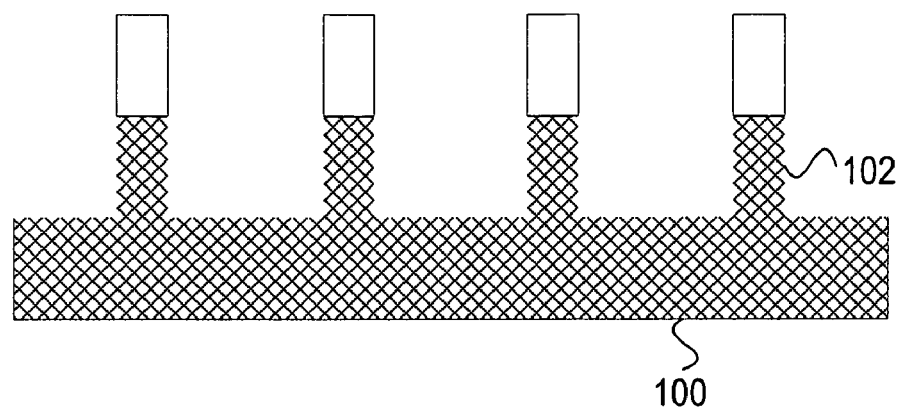
FIG. 7 illustrates the example substrate after the active layer is etched using the hard mask fins as the pattern to create active fins, according to one embodiment.

FIG. 7 illustrates the example substrate after the conductive layer 100 is etched using the hard mask fins 112, 116 as the pattern to create conductive fins 102. The conductive fins 102 may form gate electrodes, source regions, and/or drain regions. The hard mask fins 112, 116 may remain on the conductive fins 102 as the substrate is further processed.

While the embodiments described above have focused on using a hard mask layer that starts as twice the desired thickness in order to create the desired pitch using dual resist patterns and etchings, it is not limited thereto. Rather, the thickness could be increased and additional resist patterns and etchings could be used to further reduce the desired pitch without departing from the current scope. Furthermore, the embodiments were described with respect to creating fins at a desired pitch in active (e.g., polysilicon) layers but is not limited thereto.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. A method comprising
    forming a hard mask layer having a first thickness on a semiconductor substrate;
    patterning a first resist layer on the hard mask layer, wherein the first resist layer includes a first plurality of lines, and wherein adjacent lines of the first plurality of lines are separated by a first pitch;
    etching the hard mask layer to remove a first portion thereof not covered by the first resist layer to create a first plurality of fins in alignment with the first plurality of lines;
    removing the first resist layer;
    patterning a second resist layer on the hard mask layer, wherein the second resist layer includes a second plurality of lines, wherein adjacent lines of the second plurality of lines are separated by a second pitch, wherein the second plurality of lines are patterned in same direction and are interwoven with the first plurality of fins; and
    etching the hard mask layer to remove a second portion thereof not covered by the second resist layer to create a second plurality of fins in alignment with the second plurality of lines, wherein a remaining portion of the hard mask layer includes the first plurality of fins and the second plurality of fins interwoven and having a second thickness, and wherein a pitch between fins of the first plurality of fins and adjacent fins of the second plurality of fins is less than the first pitch or the second pitch.

2. The method of claim 1, further comprising removing the second resist layer.

3. The method of claim 2, further comprising etching the semiconductor substrate using the remaining portion of the hard mask layer as a pattern.

4. The method of claim 3, further comprising maintaining the remaining portion of the hard mask layer as a cap layer for further processing.

5. The method of claim 1, wherein
    the forming a hard mask layer includes forming the hard mask layer having the first thickness that is twice the second thickness;
    the etching the hard mask layer to remove a first portion includes etching the hard mask layer to remove half the first thickness; and
    the etching the hard mask layer to remove a second portion includes etching the hard mask layer to remove half the first thickness of the first plurality of fins and remaining thickness of the hard mask layer that previously had the first portion etched.

6. The method of claim 1, where in the first pitch and the second pitch are equal.

7. The method of claim 1, wherein
    the patterning a first resist layer includes patterning the first resist layer as a first plurality of lines separated by twice a desired pitch; and
    the patterning a second resist layer includes patterning the second resist layer as a second plurality of lines separated by twice the desired pitch.

8. The method of claim 1, wherein the patterning a second resist layer includes patterning the second plurality of lines centered between the first plurality of fins.

9. The method of claim 1, wherein the patterning a first resist layer and the patterning a second resist layer includes patterning with lithography.

10. A method comprising
    forming a hard mask layer on a semiconductor substrate, wherein the hard mask layer is formed with twice a desired thickness;
    patterning a first resist layer on the hard mask layer as a first plurality of lines separated by twice a desired pitch;
    etching the hard mask layer using the first resist layer as a pattern to create a first plurality of hard mask fins in alignment with the first plurality of lines, wherein the first plurality of hard mask fins are the desired thickness above etched portions of the hard mask layer;
    removing the first resist layer;
    patterning a second resist layer on the hard mask layer as a second plurality of lines, wherein the second plurality of lines are separated by twice the desired pitch, traverse the semiconductor substrate in same direction as the first plurality of lines, and are interwoven with and centered between the first plurality of hard mask fins;
    etching the hard mask layer using the second resist layer as a pattern to create a second plurality of hard mask fins in alignment with the second plurality of lines, wherein the first and the second plurality of hard mask fins are the desired thickness above the semiconductor substrate, and wherein the first plurality of hard mask fins and the second plurality of hard mask fins are interwoven at the desired pitch; and
    removing the second resist layer.

11. The method of claim 10, further comprising etching the semiconductor substrate using the first plurality of hard mask fins and the second plurality of hard mask fins as a pattern to form a plurality of semiconductor fins.

12. The method of claim 11, wherein the etching the semiconductor substrate includes forming a plurality of gate electrodes.

13. The method of claim 11, wherein the etching the semiconductor substrate includes forming a plurality of source/drain fins.

14. The method of claim 11, further comprising maintaining the first plurality of hard mask fins and the second plurality of hard mask fins as a cap layer for further processing.

15. A method comprising
    forming a hard mask layer on a semiconductor substrate, wherein the hard mask layer is formed with a first thickness capable of being etched multiple times and having a second thickness remaining, wherein the second thickness is capable of being used as a patterning layer for etching of the semiconductor substrate;
    patterning a first plurality of resist lines on the hard mask layer, wherein the first plurality of resist lines traverse the semiconductor substrate in a defined direction and adjacent first resist lines are separated by a first pitch, wherein the first pitch is attainable with patterning and is greater than a desired pitch;
    etching a first portion of the hard mask layer using the first plurality of resist lines as a pattern to create a first plurality of hard mask fins under the first plurality of resist lines, wherein the first plurality of hard mask fins are the second thickness above portions of the hard mask layer having the first portion etched;
    removing the first plurality of resist lines;
    patterning a second plurality of resist lines on the hard mask layer, wherein the second plurality of resist lines traverse the semiconductor substrate in the defined direction, are interwoven with the first plurality of hard mask fins, and adjacent second resist lines are separated by a second pitch, wherein the second pitch is attainable with patterning and is greater than the desired pitch;

etching a second portion of the hard mask layer using the second plurality of resist lines as a pattern to create a second plurality of hard mask fins under the second plurality of resist lines, wherein the first and the second plurality of hard mask fins are the second thickness above portions of the hard mask layer having the first and the second portions etched, wherein the first plurality of hard mask fins and the second plurality of hard mask fins are interwoven at a pitch that is less than the first or the second pitch;

removing the second plurality of resist lines; and etching the semiconductor substrate using remaining portions of the hard mask layer as a pattern to create semiconductor fins separated by the desired pitch.

16. The method of claim 15, wherein
the forming the hard mask layer includes forming the hard mask layer having the first thickness twice the second thickness;
the etching the first portion of the hard mask layer includes etching the second thickness for portions not covered by the first plurality of resist lines;
the etching the second portion of the hard mask layer includes etching the second thickness for portions not covered by the second plurality of resist lines; and
the etching the semiconductor substrate includes etching the semiconductor substrate using the first plurality of hard mask fins and the second plurality of hard mask fins as the pattern.

17. The method of claim 15, wherein
the patterning the first plurality of resist lines includes patterning the first plurality of resist lines to have the first pitch that is twice the desired pitch; and
the patterning the second plurality of resist lines includes patterning the second plurality of resist lines to center a second resist line between adjacent first plurality of hard mask fins and to have the second pitch that is twice the desired pitch;
wherein adjacent first resist lines and second resist lines are separated by the desired pitch.

18. The method of claim 15, wherein the patterning the first plurality of resist lines and the patterning the second plurality of resist lines include patterning with lithography.

19. The method of claim 15, further comprising maintaining the remaining portion of the hard mask layer as a cap layer for further processing.

20. The method of claim 15, further comprising
patterning a third plurality of resist lines on the hard mask layer, wherein the third plurality of resist lines traverse the semiconductor substrate in the defined direction, are interwoven with the first plurality of hard mask fins and the second plurality of hard mask fins, and adjacent third resist lines are separated by a third pitch, wherein the third pitch is attainable with patterning and is greater than the desired pitch;
etching a third portion of the hard mask layer using the third plurality of resist lines as a pattern to create a third plurality of hard mask fins under the third plurality of resist lines, wherein the first, the second and the third plurality of hard mask fins are the second thickness above portions of the hard mask layer having the first, the second and the third portions etched, wherein the first, the second and the third plurality of hard mask fins are interwoven at a pitch that is less than the first, the second or the third pitch; and
removing the third plurality of resist lines.

* * * * *